United States Patent
Gong et al.

(10) Patent No.: US 11,742,361 B2
(45) Date of Patent: Aug. 29, 2023

(54) DISPLAY SUBSTRATE AND METHOD FOR MANUFACTURING THE SAME, DISPLAY DEVICE

(71) Applicants: BOE MLED TECHNOLOGY CO., LTD., Beijing (CN); BOE TECHNOLOGY GROUP CO., LTD., Beijing (CN)

(72) Inventors: Linhui Gong, Beijing (CN); Chao Liu, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/354,122

(22) Filed: Jun. 22, 2021

(65) Prior Publication Data
US 2022/0068978 A1  Mar. 3, 2022

(30) Foreign Application Priority Data

Aug. 25, 2020  (CN) .......................... 202010866854.3

(51) Int. Cl.
*H01L 27/12* (2006.01)
*H01L 25/16* (2023.01)

(52) U.S. Cl.
CPC ........ *H01L 27/1244* (2013.01); *H01L 25/167* (2013.01); *H01L 27/1248* (2013.01); *H01L 27/1259* (2013.01)

(58) Field of Classification Search
None
See application file for complete search history.

(56) References Cited

U.S. PATENT DOCUMENTS

| 2010/0051993 A1* | 3/2010 | Shimoda ............. H01L 27/3246 |
| | | 257/E33.001 |
| 2019/0095007 A1* | 3/2019 | Jeong .................. H01L 51/5253 |

* cited by examiner

*Primary Examiner* — Bo B Jang
(74) *Attorney, Agent, or Firm* — HOUTTEMAN LAW LLC

(57) ABSTRACT

A display substrate, a method for manufacturing a display substrate and a display device are provided, and the display substrate includes: a base having a first surface, a second surface and a side surface, the base includes a display area and an epitaxial area; a driving functional layer in the display area and first binding electrodes in the epitaxial area on the first surface, the first binding electrodes are coupled with the driving functional layer; second binding electrodes located on the second surface and coupled with the first binding electrodes through side wirings; a portion of each side wiring is located on the side surface; a blocking wall on the first surface and in the epitaxial region, an orthographic projection of the blocking wall on the base at least passes through spacing regions between every two adjacent first binding electrodes along an arrangement direction of the first binding electrodes.

19 Claims, 4 Drawing Sheets

B-B':

C-C':

DISPLAY SUBSTRATE AND METHOD FOR MANUFACTURING THE SAME, DISPLAY DEVICE

CROSS REFERENCE TO RELATED APPLICATIONS

The present application claims priority to Chinese patent application No. 202010866854.3 filed at the Chinese Intellectual Property Office on Aug. 25, 2020, the contents of which is incorporated herein by reference in its entirety.

TECHNICAL FIELD

The present disclosure relates to the field of display technology, in particular to a display substrate, a manufacturing method of a display substrate and a display device.

BACKGROUND

The Micro/Mini light emitting diode (Micro/Mini-LED) display technology, as a new generation display technology, has advantages of high brightness, good light emitting efficiency, low power consumption, and the like. Generally, a Micro/Mini-LED chip is transferred to a display substrate by a transferring technology, and due to a limitation of the transferring technology, a large-sized LED display substrate cannot be directly prepared; therefore, in the related art, a plurality of small-sized LED display substrates are spliced in a splicing manner to form a large-sized display substrate.

SUMMARY

Embodiments of the disclosure provide a display substrate, a method for manufacturing a display substrate and a display device.

An embodiment of the present disclosure provides a display substrate, including:

a base having a first surface, a second surface, and a side surface, the first surface being opposite to the second surface, the side surface being connected between the first surface and the second surface, the base including a display area and an epitaxial area at a side of the display area;

a driving functional layer and a plurality of first binding electrodes, which are located on the first surface of the base, the driving functional layer is located in the display area, and the first binding electrodes are located in the epitaxial area and are electrically coupled with the driving functional layer;

a plurality of second binding electrodes located on the second surface of the base and connected with the plurality of first binding electrodes in a one-to-one correspondence through side wirings; a portion of each side wiring is located on the side surface of the base;

a blocking wall located on the first surface of the base, the blocking wall is located in the epitaxial area, and an orthographic projection of the blocking wall on the base at least passes through spacing regions between every two adjacent first binding electrodes along an arrangement direction of the first binding electrodes.

In some implementations, an orthographic projection of the blocking wall on the base is a continuous pattern, a portion of the blocking wall is located on a side of the first binding electrodes away from the base, and the rest of the blocking wall is located in the spacing regions between every two adjacent first binding electrodes.

In some implementations, an orthographic projection of the blocking wall on the base does not overlap with orthographic projections of the first binding electrodes on the base.

In some implementations, a distance between the blocking wall and a boundary of the display area is 0.08 to 0.2 times a width of the epitaxial region.

In some implementations, each first binding electrode includes: an electrode main body part and a transmission part, the transmission part is coupled between the electrode main body part and the driving functional layer, a conductive protection layer is arranged on a side, away from the base, of the electrode main body part, and a portion of the side wiring is located on a side, away from the base, of the conductive protection layer and coupled with the conductive protection layer.

In some implementations, edges of a plurality of conductive protection layers proximal to the display area are located on a first boundary, and the blocking wall is located between the display area and the first boundary.

In some implementations, a distance between the blocking wall and the first boundary is 0.04 to 0.1 times a width of the epitaxial area, and a distance between the blocking wall and a boundary of the display area is 0.08 to 0.15 times the width of the epitaxial area.

In some implementations, the display substrate further includes a plurality of light emitting devices, and the drive functional layer includes:

a first conductive pattern including a plurality of signal transmission lines coupled to the first binding electrodes;

a first insulating layer located on a side, away from the base, of the first conductive pattern;

a second conductive pattern located on a side, away from the base, of the first conductive pattern and including a plurality of coupling electrodes, and the coupling electrodes are coupled with the signal transmission lines through first via holes in the first insulating layer;

a second insulating layer located on a side, away from the base, of the second conductive pattern;

pins of the light emitting devices are coupled to the coupling electrodes through second via holes in the second insulating layer, and a surface, away from the base, of the blocking wall is not lower than a surface, away from the base, of the second insulating layer.

In some implementations, the blocking wall includes a first blocking wall portion and a second blocking wall portion, the first blocking wall portion and the first insulating layer are disposed in a same layer, and the second blocking wall portion and the second insulating layer are disposed in a same layer.

In some implementations, the first blocking wall portion includes a first blocking layer and a second blocking layer sequentially disposed along a direction away from the base.

In some implementations, the second blocking wall portion includes a third blocking layer, a fourth blocking layer, and a fifth blocking layer sequentially disposed along the direction away from the base.

In some implementations, the first insulating layer includes a first inorganic layer and a first organic layer sequentially disposed along a direction away from the base, and the second insulating layer includes a second inorganic layer, a second organic layer, and a third inorganic layer sequentially disposed along the direction away from the base.

In some implementations, the first blocking layer is disposed in the same layer as the first inorganic layer, and the second blocking layer is disposed in the same layer as the first organic layer.

In some implementations, the third blocking layer is disposed in the same layer as the second inorganic layer, the fourth blocking layer is disposed in the same layer as the second organic layer, and the fifth blocking layer is disposed in the same layer as the third inorganic layer.

In some implementations, a height of a surface of the blocking wall away from the base is 1 to 1.3 times a height of a surface of the second insulating layer away from the base.

An embodiment of the present disclosure further provides a display device, including the display substrate described above.

An embodiment of the present disclosure further provides a method for manufacturing a display substrate, including the following steps:

providing a base having a first surface, a second surface, and a side surface, the first surface being opposite to the second surface, the side surface being connected between the first surface and the second surface, the base including a display area and an epitaxial area at a side of the display area;

forming a driving functional layer and a plurality of first binding electrodes on the first surface of the base, where the driving functional layer being located in the display area, and the plurality of first binding electrodes being located in the epitaxial area and electrically coupled with the driving functional layer;

forming a plurality of second binding electrodes on the second surface of the base, the plurality of second binding electrodes corresponding to the plurality of first binding electrodes one to one;

forming a blocking wall on the first surface of the base, where the blocking wall being positioned in the epitaxial area, and an orthographic projection of the blocking wall on the base at least passes through spacing regions between every two adjacent first binding electrodes along an arrangement direction of the first binding electrodes; and forming side wirings being in one-to-one corresponding coupling with the first binding electrodes on the base formed with the blocking wall, where the second binding electrodes being coupled with the first binding electrodes through the side wirings one to one; a portion of each side wiring being located on the side surface of the base.

DRAWINGS

The accompanying drawings, which are included to provide a further understanding of the disclosure and are incorporated in and constitute a part of this specification, illustrate embodiments of the disclosure and together with the description serve to explain the disclosure, but do not constitute a limitation of the disclosure. In the drawings.

DETAILED DESCRIPTION

Figure 1:
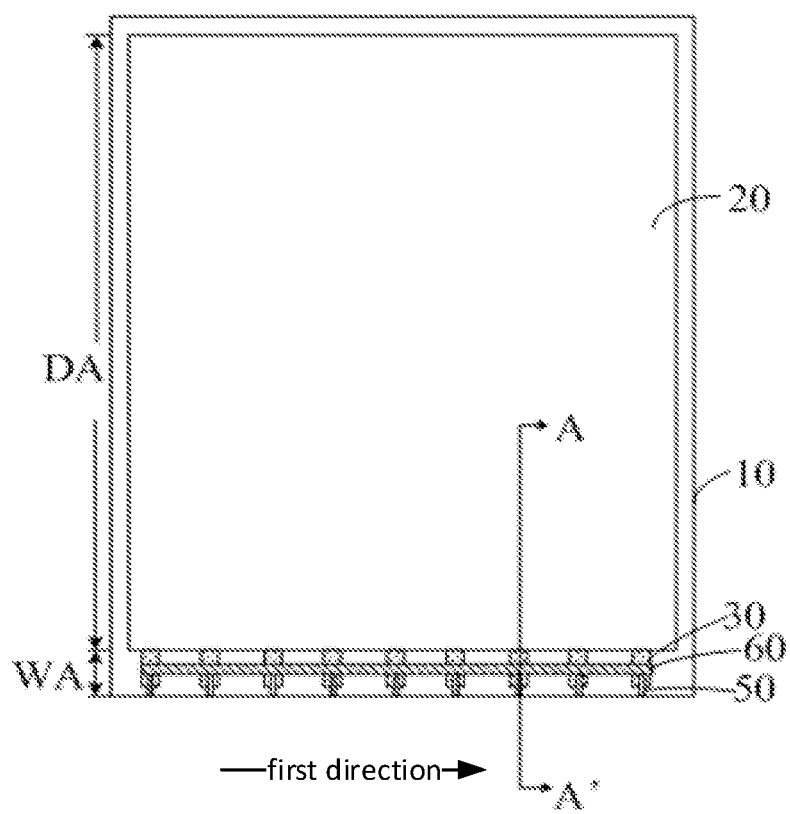
FIG. 1 is a schematic diagram of a first surface of a base of a display substrate in an embodiment of the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the disclosure without creative labor, are within the protection scope of the present disclosure.

Unless defined otherwise, technical or scientific terms used herein shall have the ordinary meaning as understood by one of ordinary skill in the art to which the present disclosure belongs. The use of "first", "second" and the like in the present disclosure is not intended to indicate any order, quantity, or importance, but rather is used to distinguish one element from another. Also, the use of the terms "a", "an" or "the" and similar referents does not denote a limitation of quantity, but rather denotes the presence of at least one. The word "include" or "comprise", and the like, is intended to mean that the element or item preceding the word contains the element or item listed after the word and its equivalent, but not the exclusion of other elements or items. The terms "coupled" or "connected" and the like are not restricted to physical or mechanical connections, but may include electrical connections, whether direct or indirect. The positional relationship words "upper" and the like are used merely to indicate relative positional relationships, which may change accordingly when an absolute position of the object being described changes.

In the following description, when an element or layer is referred to as being "on" or "connected to" another element or layer, it can be directly on or connected to another element or layer, or intervening elements or layers may be present. However, when an element or layer is referred to as being "directly on" or "directly connected to" another element or layer, there are no intervening elements or layers present. The term "and/or" includes any and all combinations of one or more of the associated listed items.

Although the terms first, second, etc. may be used herein to describe various elements, components, regions, layers and/or sections, these elements, components, regions, layers and/or sections should not be limited by these terms. These terms are used to distinguish one element, component, region, layer or section from another element, component, region, layer or section.

A small-sized display substrate generally includes a display area and an epitaxial area, where first binding electrodes are arranged in the epitaxial area, and the first binding electrodes are connected with second binding electrodes on a back side of the display substrate through wires on a side surface of the display substrate and then coupled with a flexible circuit board. When the wires are formed on the side surface of the display substrate, conductive materials easily enter the display area, so that short circuit occurs between conductive structures in the display area, and the yield of the display substrate is affected.

Figure 2:
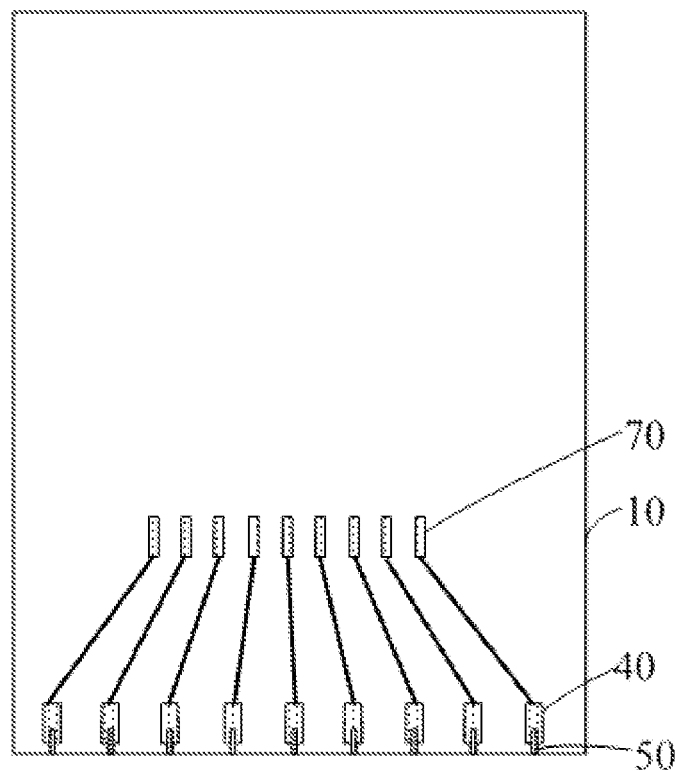
FIG. 2 is a schematic diagram of a second surface of a base of a display substrate in an embodiment of the present disclosure.
Figure 3:
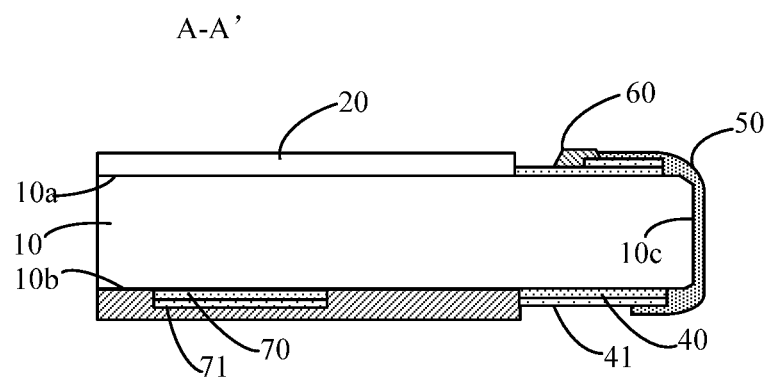
FIG. 3 is an overall sectional view taken along line A-A' of FIG. 1.

FIG. 1 is a schematic diagram of a first surface of a base of a display substrate in an embodiment of the present disclosure, FIG. 2 is a schematic diagram of a second surface of the base of the display substrate in an embodiment of the present disclosure, and FIG. 3 is an overall sectional view taken along a line A-A' in FIG. 1. As shown in FIGS. 1 to 3, the display substrate includes: a base 10, a driving functional layer 20, a plurality of first binding electrodes 30, a plurality of second binding electrodes 40, and a plurality of side wirings 50. The base 10 has a first surface 10*a*, a second surface 10*b*, and a side surface 10*c*, where the first surface 10*a* and the second surface 10*b* are two opposite surfaces of the base 10, and the side surface 10*c* is connected between the first surface 10*a* and the second surface 10*b*. The base 10 includes a display area DA and an epitaxial area WA located at a side of the display area DA. As an example, the base 10 may be a glass base 10.

The driving functional layer 20 and the plurality of first binding electrodes 30 are disposed on the first surface 10*a* of the base 10, the driving functional layer 20 is located in the display area DA, and the first binding electrodes 30 are located in the epitaxial area WA and electrically coupled to the driving functional layer 20. Light emitting devices may be disposed on the driving functional layer 20, and the driving functional layer 20 is configured to provide a driving signal to the light emitting devices to drive the light emitting devices to emit light. The light emitting devices may be light emitting diodes, such as Mini-LEDs or Micro-LEDs.

The second binding electrodes 40 are disposed on the second surface 10*b* of the base 10, the second binding electrodes 40 are coupled to the first binding electrodes 30 in a one-to-one correspondence through side wirings 50, and a portion of each of the side wirings 50 is located on the side surface of the base 10. In some implementations, as shown in FIGS. 2 and 3, the second surface 10*b* of the base 10 may further be provided with third binding electrodes 70 coupled to the second binding electrodes 40 in a one-to-one correspondence manner, and the third binding electrodes 70 are used for binding with a flexible printed circuit (FPC) so as to provide driving signals from a driving chip on the FPC to the driving functional layer 20.

In a process of manufacturing the display substrate, when the side wirings 50 are formed, a magnetron sputtering process or an electroplating process may be used to form a metal film layer, and then the metal film layer is etched, so that a plurality of side wirings 50 are formed. During etching, a laser etching method may be adopted. In order to avoid damage to the structures in the display area DA caused by heat generated during laser etching, when the metal film layer is formed, a blocking film may be attached to the display area DA, then the metal film layer is formed, and after the metal film layer is formed, the blocking film is peeled off. However, in an actual operation, the blocking film is not closely attached to the display area DA, so that some metal ions still enter the display area DA, and a short circuit occurs between different first binding electrodes 30.

To solve this problem, as shown in FIGS. 1 and 3, an embodiment of the present disclosure provides a blocking wall 60 on the first surface 10*a* of the base 10, the blocking wall 60 is located in the epitaxial region WA, and an orthographic projection of the blocking wall 60 on the base 10 at least passes through spacing regions between every two adjacent first binding electrodes 30 along an arrangement direction of the first binding electrodes 30. The plurality of first binding electrodes 30 are arranged in a first direction in FIG. 1.

It should be noted that, the orthographic projection of the blocking wall 60 on the base 10 at least passes through the spacing region between every two adjacent first binding electrodes 30 along the arrangement direction of the plurality of first binding electrodes 30, which means that the blocking wall 60 at least includes first blocking portions located between every two adjacent first binding electrodes 30, and an orthographic projection of each first blocking portion on the base 10 extends from an orthographic projection of one first binding electrode 30 on the base 10 to an orthographic projection of another first binding electrode 30 on the base 10.

In an implementation, the blocking wall 60 is disposed in the epitaxial region WA, and the blocking wall 60 is at least located in the spacing region between two adjacent first binding electrodes 30, so that when the metal film layer is formed in the epitaxial region WA, under the blocking effect of the blocking wall 60, metal ions cannot enter the display region DA from the spacing region between two adjacent first binding electrodes 30, thereby preventing a short circuit between two adjacent first binding electrodes 30, and ensuring the yield of the display substrate.

Figure 4:
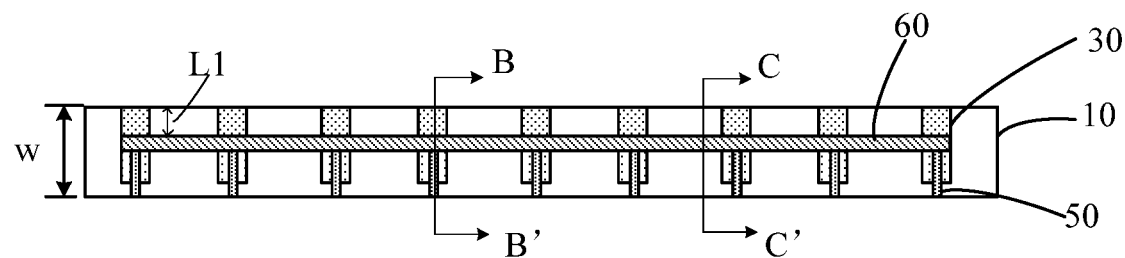
FIG. 4 is a plan view of an epitaxial area on a first surface of a base in an embodiment of the present disclosure.

FIG. 4 is a plan view of an epitaxial region on the first surface of the base according to an embodiment of the present disclosure, as shown in FIG. 4, in some implementations, the orthographic projection of the blocking wall 60 on the base 10 is a continuous pattern, a portion of the blocking wall 60 is located on a side of the first binding electrodes 30 away from the base 10, and the rest of the blocking wall 60 is located in spacing regions between every two adjacent first binding electrodes 30.

Figure 5:
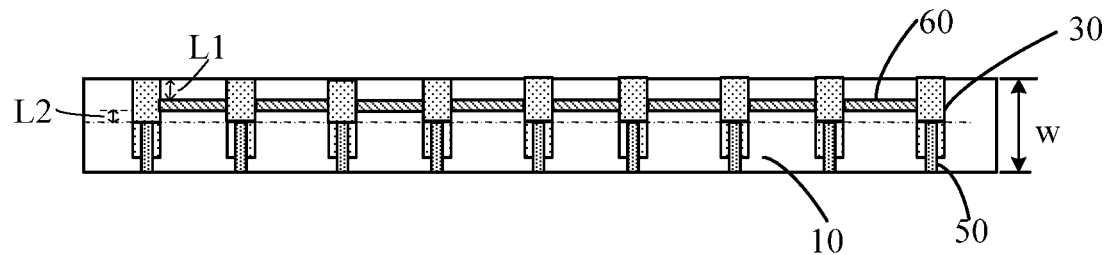
FIG. 5 is another plan view of an epitaxial area on a first surface of a base in an embodiment of the present disclosure.

FIG. 5 is another plan view of the epitaxial region on the first surface of the base in an embodiment of the present disclosure, as shown in FIG. 5, in other implementations, the blocking wall 60 includes a plurality of blocking portions disposed at intervals, and an orthographic projection of each blocking portion on the base 10 is located in the spaced region between two adjacent first binding electrodes 30, that is, the orthographic projection of the blocking wall 60 on the base 10 does not overlap with the orthographic projection of the first binding electrodes 30 on the base 10.

Figure 6:
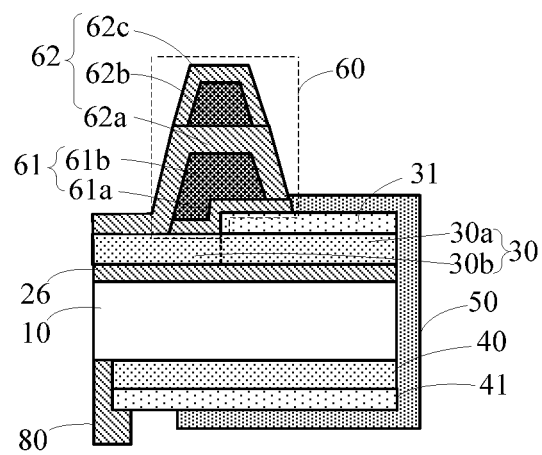
FIG. 6 is a sectional view taken along line B-B' of FIG. 4.
Figure 7:
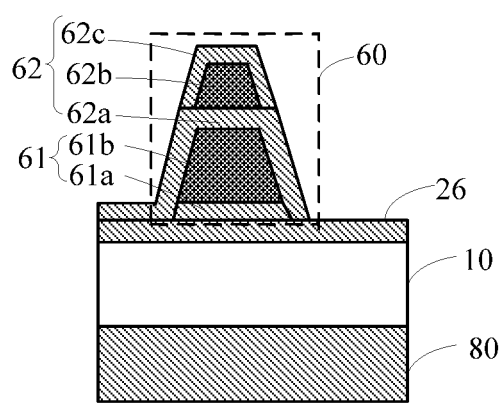
FIG. 7 is a sectional view taken along line C-C' of FIG. 4.

FIG. 6 is a sectional view taken along the line B-B' of FIG. 4, and FIG. 7 is a sectional view taken along the line C-C' of FIG. 4. In this regard, for the blocking wall 60 shown in FIG. 5, a longitudinal sectional structure thereof can be seen in FIG. 7. As shown in FIG. 6, the first binding electrode 30 includes an electrode main body part 30*a* and a transmission part 30*b*, the transmission part 30*b* is coupled between the electrode main body part 30*a* and the driving functional layer 20, a conductive protection layer 31 is arranged on a side of the electrode main body part 30*a* away from the base 10, and a portion of the side wiring 50 is located on a side of the conductive protection layer 31 away from the base 10 and is in contact with and coupled with the conductive protection layer 31. The conductive protection layer 31 is made of a metal oxide conductive material, and the conductive protection layer 31 can prevent the electrode main body portion 30*a* from being oxidized to affect conductivity. In addition, since the electrode main body portion 30*a* and the side wirings 50 need to be electrically coupled, the conductive protection layer 31 needs to be able to protect the electrode main body portion 30*a* from oxidation and to have a certain conductivity. In some examples, the electrode main body portion 30*a* and the transmission portion 30*b* are of an integrated structure in a single piece, e.g., both of them are made of copper. The material of the conductive protection layer 31 includes a metal oxide material with a better conductivity, such as indium tin oxide, indium gallium zinc oxide, etc.

As shown in FIGS. 4 and 5, in some implementations, a distance L1 between the blocking wall 60 and a boundary of the display area DA is 0.08 to 0.2 times a width w of the epitaxial area WA. For example, the width w of the epitaxial region WA is 120 μm, and the distance L1 between the blocking wall 60 and the boundary of the display area DA is between 10 μm and 24 μm, so that a certain distance is reserved between the metal film layer formed by sputtering and the boundary of the display area DA when the side wirings 50 are manufactured, and thus, when the metal film layer is etched by laser, the structures of the display area DA are prevented from being damaged by heat generated by etching, and an excessively large bezel cannot be formed.

It should be noted that, in an implementation, the display substrate further includes a plurality of light emitting devices disposed on the driving functional layer 20. The light emitting devices may be arranged in an array, and the boundary of the display area DA is a boundary of an area where the light emitting devices are located. The longitudinal direction of the epitaxial area WA is the arrangement direction of the plurality of first binding electrodes 30, and the width direction of the epitaxial area WA is an arrangement direction of the electrode main body portion 30*a* and the transmission portion 30*b* of the first binding electrode 30.

An outline of the conductive protection layer 31 on each first binding electrode 30 is a quadrangle including opposite first and second edges, and two side edges connected between the first and second edges, where the first edge is an edge of the conductive protection layer 31 proximal to the display area DA, and the second edge is an edge of the conductive protection layer 31 away from the display area DA. In some implementations, first edges of conductive protection layers 31 are located in a same straight line, which is referred to as a first boundary. In some implementations, the blocking wall 60 may be located on the first boundary.

In some other implementations, as shown in FIG. 5, the blocking wall 60 is located between the display area DA and the first boundary, so as to prevent the providing of the blocking wall 60 from affecting the coupling between the conductive protection layer 31 and the side wiring 50, so as to ensure the coupling stability between the side wiring 50 and the conductive protection layer 31. In some implementations, a distance L2 between the blocking wall 60 and the first boundary is 0.04 to 0.1 times the width w of the epitaxial area WA, and a distance between the blocking wall 60 and the boundary of the display area DA is 0.08 to 0.15 times the width w of the epitaxial area WA. For example, the width w of the epitaxial region WA is 120 μm, the distance L1 between the blocking wall 60 and the boundary of the display area DA is 10 μm, and the distance L2 between the blocking wall 60 and the first boundary is 5 μm.

Figure 8:
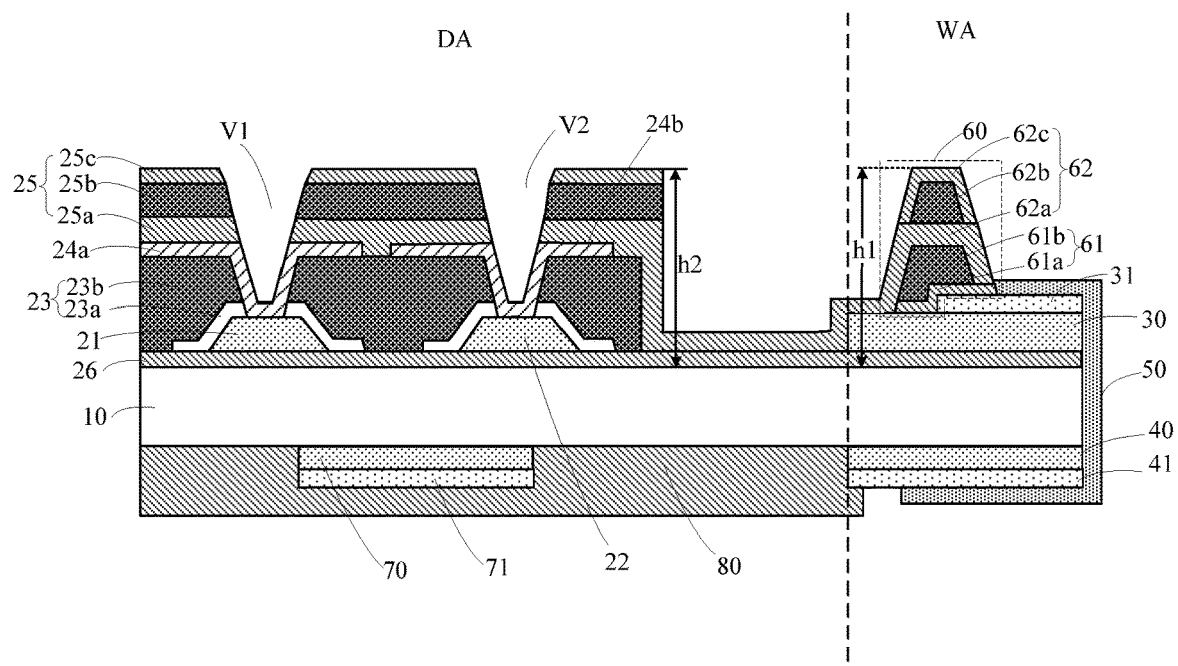
FIG. 8 is a schematic structural diagram of a display substrate in an embodiment of the present disclosure.

FIG. 8 is a schematic structural diagram of a display substrate in an embodiment of the present disclosure, and as shown in FIGS. 6 to 8, the driving functional layer 20 includes: a first conductive pattern including a plurality of signal transmission lines 21/22, a first insulating layer 23, a second conductive pattern, and a second insulating layer 25, the signal transmission lines 21/22 being coupled to the first binding electrodes 30 in a one-to-one correspondence, where the signal transmission lines 21/22 may be coupled to transmission parts 30*b* of the first binding electrodes 30. The signal transmission lines 21/22 and the first binding electrodes 30 may be disposed in a same layer. It should be noted that the term "disposed in a same layer" in the embodiments of the present disclosure means that two structures can be manufactured by a single patterning process, and therefore, the two structures are in the same layer in the overlapping relationship, but this does not mean that distances between the two structures and the base 10 are necessarily the same. When the two structures are disposed in the same layer and coupled, they may be formed as an integral structure in a single piece. It should be further noted that the structure shown in FIG. 8 is not obtained by cutting along the signal transmission lines 21/22, and therefore, in FIG. 8, a portion of the signal transmission line 21/22 located below a second via hole V1/V2 is spaced apart from the first binding electrode 30, and the signal transmission line 21/22 may be coupled with the first binding electrode 30 at a position not shown in FIG. 8.

The first insulating layer 23 is disposed on a side of the first conductive pattern away from the base 10, where the first insulating layer 23 may include a first inorganic layer 23*a* and a first organic layer 23*b*, the first inorganic layer 23*a* is disposed between the first organic layer 23*b* and the base 10, and the first inorganic layer 23*a* has a function of blocking moisture and oxygen, so as to improve the sealing property of the display substrate and prevent the first conductive pattern from being corroded by moisture and oxygen. The first inorganic layer 23*a* may be made of an inorganic material such as silicon nitride or silicon oxynitride, or may be made of another inorganic material, which is not limited herein. The first organic layer 23*b* may be made of an organic resin material, or may be made of another organic material, which is not limited herein.

The second conductive pattern is disposed on a side of the first conductive pattern away from the base 10, the second conductive pattern includes a plurality of coupling electrodes 24*a*/24*b*, the coupling electrodes 24*a* are coupled to the signal transmission lines 21 through first via holes in the first insulating layer 23, and the coupling electrodes 24*b* are coupled to the signal transmission lines 22 through first via holes in the first insulating layer 23. The second insulating layer 25 is disposed on a side of the second conductive pattern away from the base 10, and the second insulating layer 25 may include: a second inorganic layer 25*a*, a second organic layer 25*b*, and a third inorganic layer 25*c*, the second inorganic layer 25*a* is arranged between the second organic layer 25*b* and the base 10, the third inorganic layer 25*c* is arranged on a side of the second organic layer 25*b* away from the base 10, and the second inorganic layer 25*a* and the third inorganic layer 25*c* have the effect of blocking moisture and oxygen, so that the sealing performance of the display substrate is improved, and the second conductive pattern is prevented from being corroded by moisture and oxygen. The second inorganic layer 25*a* and the third inorganic layer 25*c* may be made of an inorganic material such as silicon nitride or silicon oxynitride, or may be made of another inorganic material, which is not limited herein. The second organic layer 25*b* may be made of an organic resin material, or may be made of other organic materials, which is not limited herein. In practical applications, the film layer structures specifically included in the first insulating layer 23 and the second insulating layer 25 may be increased or decreased according to actual needs, and are not particularly limited herein.

The second insulating layer 25 is provided with second via holes V1/V2 therein, and the second via holes V1/V2 correspond to the light emitting devices one to one and correspond to the coupling electrodes 24a/24b one to one. Pins of the light emitting device include a cathode pin and an anode pin, the second via hole V1 corresponds to the anode pin of the light emitting device, and the second via hole V2 corresponds to the cathode pin of the light emitting device. The second via hole V1 exposes a portion of the corresponding coupling electrode 24a, the second via hole V2 exposes a portion of the corresponding coupling electrode 24b, the anode pin of the light emitting device is coupled to the coupling electrode 24a through the second via hole V1, and the cathode pin of the light emitting device is coupled to the coupling electrode 24b through the second via hole V2.

In some implementations, a buffer layer 26 may be further disposed on the base 10, and both the first conductive pattern and the first binding electrodes 30 are located on a side of the buffer layer 26 away from the base 10. The buffer layer 26 is configured to improve bonding firmness between the first conductive pattern, the first binding electrodes 30, and the base 10. The buffer layer 26 may be made of an inorganic material such as silicon nitride or silicon oxynitride, or may be made of another inorganic material, which is not limited herein.

In order to prevent the second binding electrodes 40 and the third binding electrodes 70 from being oxidized, a conductive protection layer 41 is disposed on surfaces of the second binding electrodes 40 away from the base 10, and a conductive protection layer 71 is disposed on surfaces of the third binding electrodes 70 away from the base 10, and the conductive protection layer 71 is coupled to the side wirings 50. The material of the conductive protection layers 41 and 71 may include a metal oxide material with a better conductivity, such as indium tin oxide, indium gallium zinc oxide, etc. In addition, a passivation layer 80 is further disposed on a side of the base 10 away from the driving functional layer 20, and a portion of the conductive protection layer 71 is exposed by the passivation layer 80, so that the conductive protection layer 71 is bonded to the flexible circuit board.

In some implementations, a height h1 of a surface of the blocking wall 60 away from the base 10 is 1 to 1.3 times a height h2 of a surface of the second insulating layer 25 away from the base 10, so as to ensure that the metal ions cannot enter the display area DA when the side wirings 50 are manufactured. It should be noted that, in the embodiment of the present disclosure, the height of a certain surface refers to: a perpendicular distance from the certain surface to a surface of the base 10 proximal thereto.

In some specific examples, the height h2 of the surface of the second insulating layer 25 away from the base 10 ranges from 3.5 μm to 4.5 μm, and the height h1 of the surface of the blocking wall 60 away from the base 10 ranges from 3.5 μm to 6 μm. For example, the height h1 of the surface of the blocking wall 60 away from the base 10 and the height h2 of the surface of the second insulation layer 25 away from the base 10 each are 4 μm.

In some implementations, as shown in FIGS. 6 to 8, the blocking wall 60 includes a first blocking wall portion 61 and a second blocking wall portion 62 which are stacked, the first blocking wall portion 61 and the first insulating layer 23 are disposed in a same layer, and the second blocking wall portion 62 and the second insulating layer 25 are disposed in a same layer. As above, the first insulating layer 23 may include the first inorganic layer 23a and the first organic layer 23b, and the second insulating layer 25 may include the second inorganic layer 25a, the second organic layer 25b, and the third inorganic layer 25c, in such case, the first blocking wall portion 61 may include: a first blocking layer 61a and a second blocking layer 61b, the first blocking layer 61a is disposed in the same layer as the first inorganic layer 23a, and the second blocking layer 61b is disposed in the same layer as the first organic layer 23b. The second blocking wall portion 62 may include: a third blocking layer 62a, a fourth blocking layer 62b, and a fifth blocking layer 62c, the third blocking layer 62a is disposed in the same layer as the second inorganic layer 25a, the fourth blocking layer 62b is disposed in the same layer as the second organic layer 25b, and the fifth blocking layer 62c is disposed in the same layer as the third inorganic layer 25c.

Certainly, the first blocking wall portion 61 may include only a blocking layer disposed in the same layer as the first organic layer 23b, and the second blocking wall portion 62 may include only a blocking layer disposed in the same layer as the second organic layer 25b.

Figure 9:
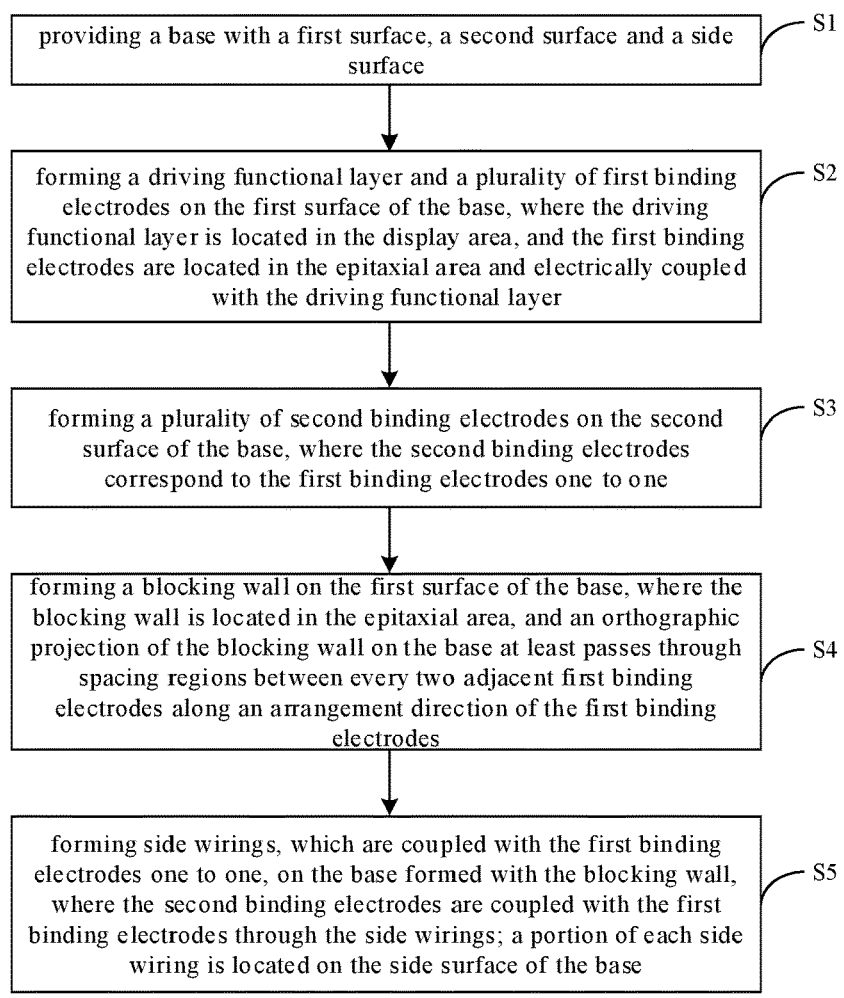
FIG. 9 is a flowchart of a method for manufacturing a display substrate according to an embodiment of the disclosure.

FIG. 9 is a flowchart of a method for manufacturing a display substrate according to an embodiment of the present disclosure, and as shown in FIG. 9, the method for manufacturing the display substrate includes following steps S1 to S5.

At step S1, providing a base with a first surface, a second surface and a side surface, where the first surface is opposite to the second surface, the side surface is connected between the first surface and the second surface, and the base includes a display area and an epitaxial area positioned at a side of the display area.

At step S2, forming a driving functional layer and a plurality of first binding electrodes on the first surface of the base, where the driving functional layer is located in the display area, and the first binding electrodes are located in the epitaxial area and electrically coupled with the driving functional layer.

At step S3, forming a plurality of second binding electrodes on the second surface of the base, where the second binding electrodes correspond to the first binding electrodes one to one.

It should be noted that, the sequence of step S2 and step S3 is not particularly limited, and step S2 may be performed before step S3, or may be performed after step S3.

At step S4, forming a blocking wall on the first surface of the base, where the blocking wall is located in the epitaxial area, and an orthographic projection of the blocking wall on the base at least passes through spacing regions between every two adjacent first binding electrodes along an arrangement direction of the first binding electrodes.

At step S5, forming side wirings, which are coupled with the first binding electrodes one to one, on the base formed with the blocking wall, where the second binding electrodes are coupled with the first binding electrodes one to one through the side wirings; a portion of each side wiring is located on the side surface of the base.

Before the step S5, a blocking film may be attached to the display area, and when the step S5 is performed, a metal film layer may be formed in the epitaxial area on the first surface, the side surface of the base, and the second surface of the base by a magnetron sputtering, and then, laser etching is performed on the metal film layer, so as to form the side wirings coupled to the first binding electrodes in a one-to-one correspondence manner.

Under the blocking effect of the blocking wall, when the metal film layer is formed by magnetron sputtering in step S5, metal ions cannot enter the display area through the spacing region between the first binding electrodes, thereby preventing the short circuit between different first binding electrodes caused by difficulty in etching the metal film layer in the display area.

As described above, the driving functional layer includes: a first conductive pattern, a first insulating layer, a second conductive pattern, and a second insulating layer; the blocking wall includes a first blocking wall portion and a second blocking wall portion. In this case, the first conductive pattern may be formed in synchronization with the first blocking wall portion, and the second blocking wall portion may be formed in synchronization with the second insulating layer.

An embodiment of the present disclosure further provides a display device, including the display substrate described above. In some implementations, the display device may be any product or component having a display function, such as a mobile phone, a tablet computer, a television, a display, a notebook computer, a digital photo frame, a navigator, and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A display substrate, comprising:
a base having a first surface, a second surface, and a side surface, the first surface being opposite to the second surface, the side surface being connected between the first surface and the second surface, the base including a display area and an epitaxial area at a side of the display area;
a driving functional layer and a plurality of first binding electrodes, which are located on the first surface of the base, wherein the driving functional layer is located in the display area, and the first binding electrodes are located in the epitaxial area and are electrically coupled with the driving functional layer;
a plurality of second binding electrodes located on the second surface of the base and connected with the first binding electrodes in a one-to-one correspondence through side wirings; wherein a portion of each side wiring is located on the side surface of the base;
a blocking wall located on the first surface of the base, wherein the blocking wall is located in the epitaxial area, and an orthographic projection of the blocking wall on the base at least passes through spacing regions between every two adjacent first binding electrodes along an arrangement direction of the first binding electrodes, and
a plurality of light emitting devices,
wherein the drive functional layer comprises:
a first conductive pattern comprising a plurality of signal transmission lines coupled to the first binding electrodes;
a first insulating layer located on a side, away from the base, of the first conductive pattern;
a second conductive pattern located on a side, away from the base, of the first conductive pattern and comprising a plurality of coupling electrodes, and the coupling electrodes are coupled with the signal transmission lines through first via holes in the first insulating layer, and a second insulating layer located on a side, away from the base, of the second conductive pattern, wherein pins of the light emitting devices are coupled to the coupling electrodes through second via holes in the second insulating layer, and a surface, away from the base, of the blocking wall is not lower than a surface, away from the base, of the second insulating layer.

2. The display substrate of claim 1, wherein the orthographic projection of the blocking wall on the base is a continuous pattern, a portion of the blocking wall is located on a side of the first binding electrodes away from the base, and the rest of the blocking wall is located in the spacing regions between every two adjacent first binding electrodes.

3. The display substrate of claim 2, wherein a distance between the blocking wall and a boundary of the display region is 0.08 to 0.2 times a width of the epitaxial region.

4. The display substrate of claim 2, wherein each first binding electrode comprises: an electrode main body part and a transmission part, the transmission part is coupled between the electrode main body part and the driving functional layer, a conductive protection layer is arranged on a side, away from the base, of the electrode main body part, and a portion of the side wiring is located on a side, away from the base, of the conductive protection layer and coupled with the conductive protection layer.

5. The display substrate of claim 1, wherein the orthographic projection of the blocking wall on the base does not overlap with orthographic projections of the first binding electrodes on the base.

6. The display substrate of claim 1, wherein a distance between the blocking wall and a boundary of the display area is 0.08 to 0.2 times a width of the epitaxial region.

7. The display substrate of claim 1, wherein each first binding electrode comprises: an electrode main body part and a transmission part, the transmission part is coupled between the electrode main body part and the driving functional layer, a conductive protection layer is arranged on a side, away from the base, of the electrode main body part, and a portion of the side wiring is located on a side, away from the base, of the conductive protection layer and coupled with the conductive protection layer.

8. The display substrate of claim 7, wherein edges of conductive protection layers proximal to the display area are located on a first boundary, and the blocking wall is located between the display area and the first boundary.

9. The display substrate of claim 8, wherein a distance between the blocking wall and the first boundary is 0.04 to 0.1 times a width of the epitaxial area, and a distance between the blocking wall and a boundary of the display area is 0.08 to 0.15 times the width of the epitaxial area.

10. The display substrate of claim 1, wherein the blocking wall comprises a first blocking wall portion and a second blocking wall portion, the first blocking wall portion and the first insulating layer are disposed in a same layer, and the second blocking wall portion and the second insulating layer are disposed in a same layer.

11. The display substrate of claim 10, wherein the first blocking wall portion comprises a first blocking layer and a second blocking layer sequentially disposed along a direction away from the base.

12. The display substrate of claim 11, wherein the second blocking wall portion comprises a third blocking layer, a fourth blocking layer, and a fifth blocking layer sequentially disposed along the direction away from the base.

13. The display substrate of claim 12, wherein the first insulating layer comprises a first inorganic layer and a first organic layer sequentially disposed along a direction away from the base, and the second insulating layer comprises a second inorganic layer, a second organic layer, and a third inorganic layer sequentially disposed along the direction away from the base.

14. The display substrate of claim 13, wherein the third blocking layer is disposed in the same layer as the second inorganic layer, the fourth blocking layer is disposed in the same layer as the second organic layer, and the fifth blocking layer is disposed in the same layer as the third inorganic layer.

15. The display substrate of claim 11, wherein the first insulating layer comprises a first inorganic layer and a first organic layer sequentially disposed along a direction away from the base, and the second insulating layer comprises a second inorganic layer, a second organic layer, and a third inorganic layer sequentially disposed along the direction away from the base.

16. The display substrate of claim 15, wherein the first blocking layer is disposed in the same layer as the first inorganic layer, and the second blocking layer is disposed in the same layer as the first organic layer.

17. The display substrate of claim 1, wherein a height of a surface of the blocking wall away from the base, from the base, is 1 to 1.3 times a height of a surface of the second insulating layer away from the base, from the base.

18. A display device, comprising the display substrate of claim 1.

19. A method for manufacturing a display substrate, comprising:
providing a base having a first surface, a second surface, and a side surface, the first surface being opposite to the second surface, the side surface being connected between the first surface and the second surface, the base comprising a display area and an epitaxial area at a side of the display area;
forming a driving functional layer and a plurality of first binding electrodes on the first surface of the base, the driving functional layer being located in the display area, and the plurality of first binding electrodes being located in the epitaxial area and electrically coupled with the driving functional layer;
forming a plurality of second binding electrodes on the second surface of the base, the plurality of second binding electrodes corresponding to the plurality of first binding electrodes one to one;
forming a blocking wall on the first surface of the base, the blocking wall being positioned in the epitaxial area, and an orthographic projection of the blocking wall on the base at least passes through spacing regions between every two adjacent first binding electrodes along an arrangement direction of the first binding electrodes; and
forming side wirings, coupled with the first binding electrodes one to one, on the base formed with the blocking wall, the second binding electrodes being coupled with the first binding electrodes through the side wirings; a portion of each side wiring being located on the side surface of the base, and
forming a plurality of light emitting devices,
wherein forming the drive functional layer comprises:
forming a first conductive pattern comprising a plurality of signal transmission lines coupled to the first binding electrodes;
forming a first insulating layer located on a side, away from the base, of the first conductive pattern;
forming a second conductive pattern located on a side, away from the base, of the first conductive pattern and comprising a plurality of coupling electrodes, and the coupling electrodes are coupled with the signal transmission lines through first via holes in the first insulating layer;
forming a second insulating layer on a side, away from the base, of the second conductive pattern, wherein
pins of the light emitting devices are coupled to the coupling electrodes through second via holes in the second insulating layer, and a surface, away from the base, of the blocking wall is not lower than a surface, away from the base, of the second insulating layer.

* * * * *